US00RE34311E

United States Patent [19]

Millis et al.

[11] E Patent Number: Re. 34,311

[45] Reissued Date of Patent: Jul. 13, 1993

[54] SEMICONDUCTOR SLICE CASSETTE TRANSPORT UNIT

[75] Inventors: Edwin G. Millis, Dallas; Alton D. Lewis, Garland, both of Tex.; Thomas C. Bimer, Placitas, N. Mex.

[73] Assignee: Texas Instruments Incorporated, Dallas, Tex.

[21] Appl. No.: 297,818

[22] Filed: Jan. 13, 1989

Related U.S. Patent Documents

Reissue of:

[64] Patent No.: 4,636,128
Issued: Jan. 13, 1987
Appl. No.: 646,385
Filed: Aug. 30, 1984

[51] Int. Cl.[5] ..... B65G 65/00

[52] U.S. Cl. ..... 414/217; 414/403; 414/404; 414/786

[58] Field of Search ..... 414/217, 292, 700, 733, 414/220, 221, 403, 404, 414, 422, 592, 8; 901/21; 474/134; 220/371, 1.5

[56] References Cited

U.S. PATENT DOCUMENTS

| | | | |
|---|---|---|---|
| 589,003 | 8/1897 | Luther | 474/134 |
| 3,004,682 | 10/1961 | Bertolini et al. | 220/1.5 |
| 3,073,466 | 1/1963 | Greer et al. | 220/1.5 X |
| 3,667,626 | 6/1972 | Torelli et al. | 414/217 |
| 4,043,451 | 8/1977 | Johnson | 206/334 |
| 4,047,624 | 9/1977 | Dorenbos | 214/17 B |
| 4,135,625 | 1/1979 | Merrill | 204/445 |
| 4,208,159 | 6/1980 | Uehara et al. | 414/225 |
| 4,293,249 | 10/1981 | Whelan | 414/217 X |
| 4,343,584 | 8/1982 | Hudgins | 414/222 |
| 4,358,908 | 11/1982 | Song | 220/371 X |
| 4,407,077 | 10/1983 | Smith | 474/134 X |
| 4,411,575 | 10/1983 | Miller | 414/217 |
| 4,412,771 | 11/1983 | Gerlach et al. | 414/222 X |
| 4,433,951 | 2/1984 | Koch et al. | 414/217 |
| 4,501,527 | 2/1985 | Jacoby et al. | 414/225 |
| 4,527,446 | 7/1985 | Borodin | 901/21 X |
| 4,532,816 | 8/1985 | Miller | 414/217 X |
| 4,532,970 | 8/1985 | Tullis et al. | 141/98 |
| 4,534,389 | 8/1985 | Tullis | 141/98 |
| 4,550,242 | 10/1985 | Uehara et al. | 414/331 X |
| 4,553,069 | 11/1985 | Purser | 315/111.81 |
| 4,557,382 | 12/1985 | Johnson | 206/444 |
| 4,582,219 | 4/1986 | Mortensen et al. | 220/326 |
| 4,588,086 | 5/1986 | Coe | 206/444 |
| 4,616,683 | 10/1986 | Tullis et al. | 141/98 |
| 4,674,939 | 6/1987 | Maney et al. | 414/292 |

FOREIGN PATENT DOCUMENTS 0138473 4/1985 European Pat. Off. .

*Primary Examiner*—David A. Bucci
*Attorney, Agent, or Firm*—Gary C. Honeycutt; Richard L. Donaldson; William E. Hiller

[57] ABSTRACT

A transport mechanism (40) for transporting a semiconductor slice cassette between a clean carrier (10) and a process machine comprises a housing (41) having a forward portion (42) positioned in the people-occupied area of the clean room and a rear portion (46) positioned in the process machine area aerodynamically isolated from people. A moveable glider plate (50) is adapted to receive the carrier (10) and is initially positioned in an aperture provided in the upper surface of forward portion (42). A gearing mechanism (54) is provided which cooperates with glider plate (50) to move the semiconductor slice cassettes mounted on the base of carrier (10) between forward portion (42) and rear portion (46). The semiconductor slices are shielded from particulate contamination as the semiconductor cassette is transported on glider plate (50) between forward portion (42) and rear portion (46) and for evacuating any particulate contamination generated within transport mechanism (40) to create a negative pressure therein relative to the people-occupied area and the process machine area.

32 Claims, 5 Drawing Sheets

FIG. 1
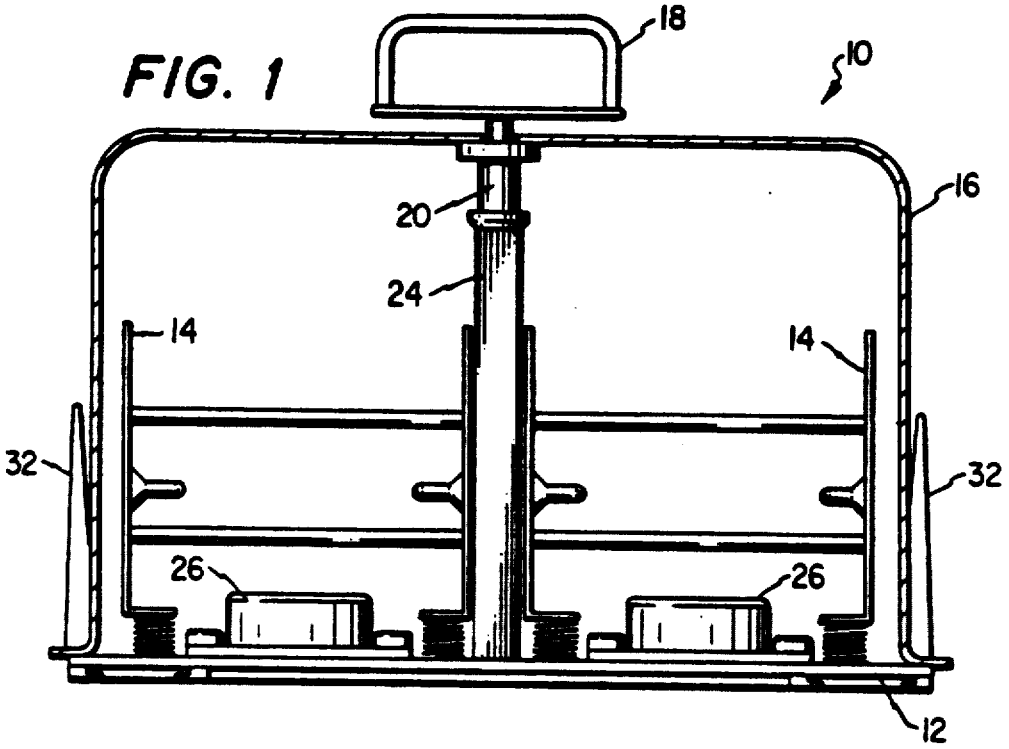
FIG. 2
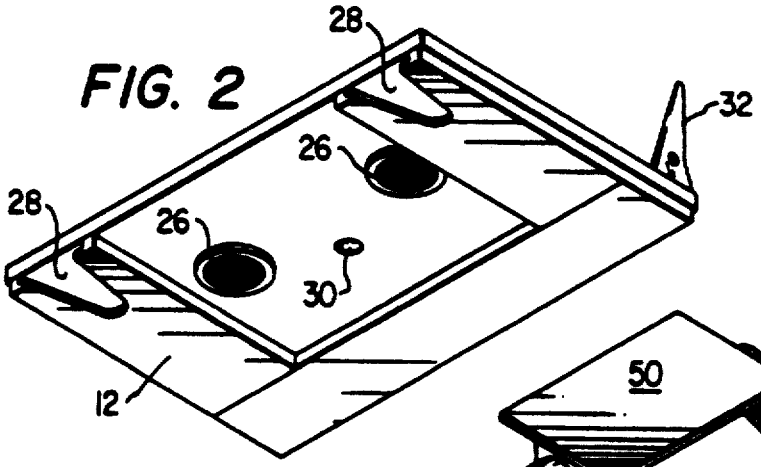
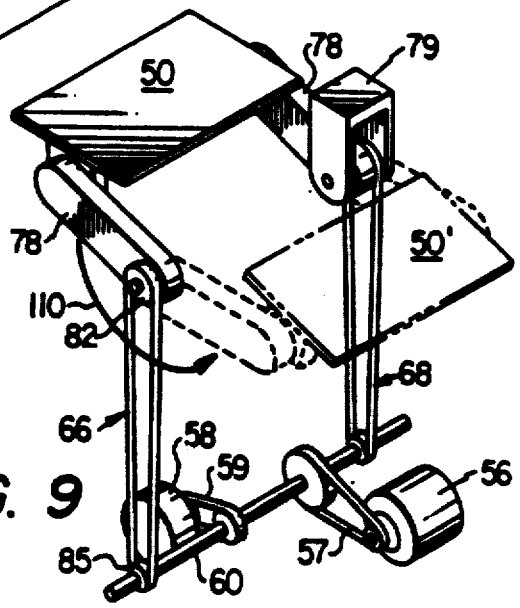
FIG. 9

18
16
49
52
12
14
42
50
41
55
88
54
68
14
52'
12
46
88
50'
60
74
59
57
58
56
65
64
62

SEMICONDUCTOR SLICE CASSETTE TRANSPORT UNIT

Matter enclosed in heavy brackets [ ] appears in the original patent but forms no part of this reissue specification; matter printed in italics indicates the additions made by reissue.

TECHNICAL FIELD

This invention relates generally to transport devices and more specifically to a transport mechanism for shielding semiconductor slices from particulate contamination while transporting and storing the semiconductor slices between a portable carrying unit and a process machine.

BACKGROUND OF THE INVENTION

Integrated circuit fabrication begins with a thin slice of single crystal semiconductor, usually silicon, and employs a combination of physical and chemical processes to create the integrated circuit structure. The fabrication process is very sensitive to particulate contamination and airborne particulates must be minimimized during the fabrication sequence, as even very small particles on the wafer surface may cause device defects. A reduced particle fabrication ambience is normally achieved by the use of vertical laminar-flow (VLF) clean rooms. Lint-free garments are normally worn by persons working within those clean rooms to minimize operator-borne particles.

Tests have shown, however, that clean rooms can only reduce airborne particulate levels to approximately 10–20 particles per cubic foot in areas where people are working, though clean levels of less then one particle per cubic foot can be achieved in areas aerodynamically isolated from people. Thus, where particle contamination densities of less than one particle per cubic foot are required, the semiconductor slices currently cannot be exposed to VLF air in a clean room occupied by people.

Various techniques have been developed for aerodynamically isolating selected portions of a clean room from people. One such technique involves the use of air-drops or panels dropped from the filter ceiling of the clean room to enclose a people-free area, such as a process machine. Another technique uses a portable carrying apparatus, termed a clean carrier, for storing and transporting semiconductor slice cassettes within the people-occupied area of the clean room. Such a carrier is described in co-pending application Ser. No. 644,282, filed Aug. 27, 1984 entitled SEMICONDUCTOR SLIDE CASSETTE CARRIER, and shields the semiconductor slices from VLF air in the people-occupied environment.

Previously, when it was desired to load a cassette of slices or the slices themselves into a machine, the loading operation was performed by hand. Thus even using a clean carrier in combination with air panels, the slices would nonetheless be exposed to particulate contamination during the loading process. A need has arisen therefore for a mechanism for transporting the semiconductor slices from the clean carrier to a process machine without exposing the slices to the people-occupied environment. The present invention is thus directed to a transport unit designed to be used in conjunction with the clean carrier of the co-pending patent application identified above to transport cassettes and slices between the clean carrier in the people-occupied area of the clean room and a process machine area aerodynamically isolated from people, without exposing the slices. to particulate contamination or introducing particulate contamination to the process machine area.

SUMMARY OF THE INVENTION

The present invention disclosed and described herein comprises a transport mechanism for use in conjunction with a clean carrier containing semiconductor slice cassettes. The transport mechanism is designed to transport cassettes and slices between the clean carrier in the people-occupied area of a clean room and a process machine area aerodynamically isolated from people, without exposing the slices to particulate contamination or introducing particulate contamination to the process machine area. The transport unit in conjunction with the clean carrier thus reduces particulate contamination to less than 0.05 particles/cm$^2$.

The transport mechanism comprises a substantially rectangular housing having a forward portion positioned in the people-occupied area of the clean room and a rear portion positioned in the process machine area. The rear portion is isolated from the forward portion behind an air drop panel extending from the ceiling of the clean room. The transport unit is designed to accept a clean carrier containing semiconductor slice cassettes at the upper surface of the forward portion. The transport unit includes a moveable glider plate constructed to matingly engage with the base of the clean carrier and thus lock the clean carrier in place on the unit. When the transport mechanism is activated, the clean carrier is opened by sealing the carrier cover onto the top surface of the forward portion of the unit. The glider plate, along with the semiconductor slice cassettes, will drop away from the cover and be transported through the housing and be repositioned proximate the upper surface of the rear portion. The semiconductor slices are thus moved into position for loading the process machine. If desired, the process may be reversed to reseal the cassettes and slices within the clean carrier.

BRIEF DESCRIPTION OF THE DRAWINGS

A more complete understanding of the invention can be had by reference to the following detailed description taken in conjunction with the accompanying Drawings in which:

FIG. 1 is a sectional view of the clean carrier which is used in conjunction with the transport mechanisms of the present invention;

FIG. 2 is a bottom view of the clean carrier of FIG. 1;

FIG. 9 illustrates the movement of the glider plate.

DETAILED DESCRIPTION OF THE INVENTION

Figure 3:
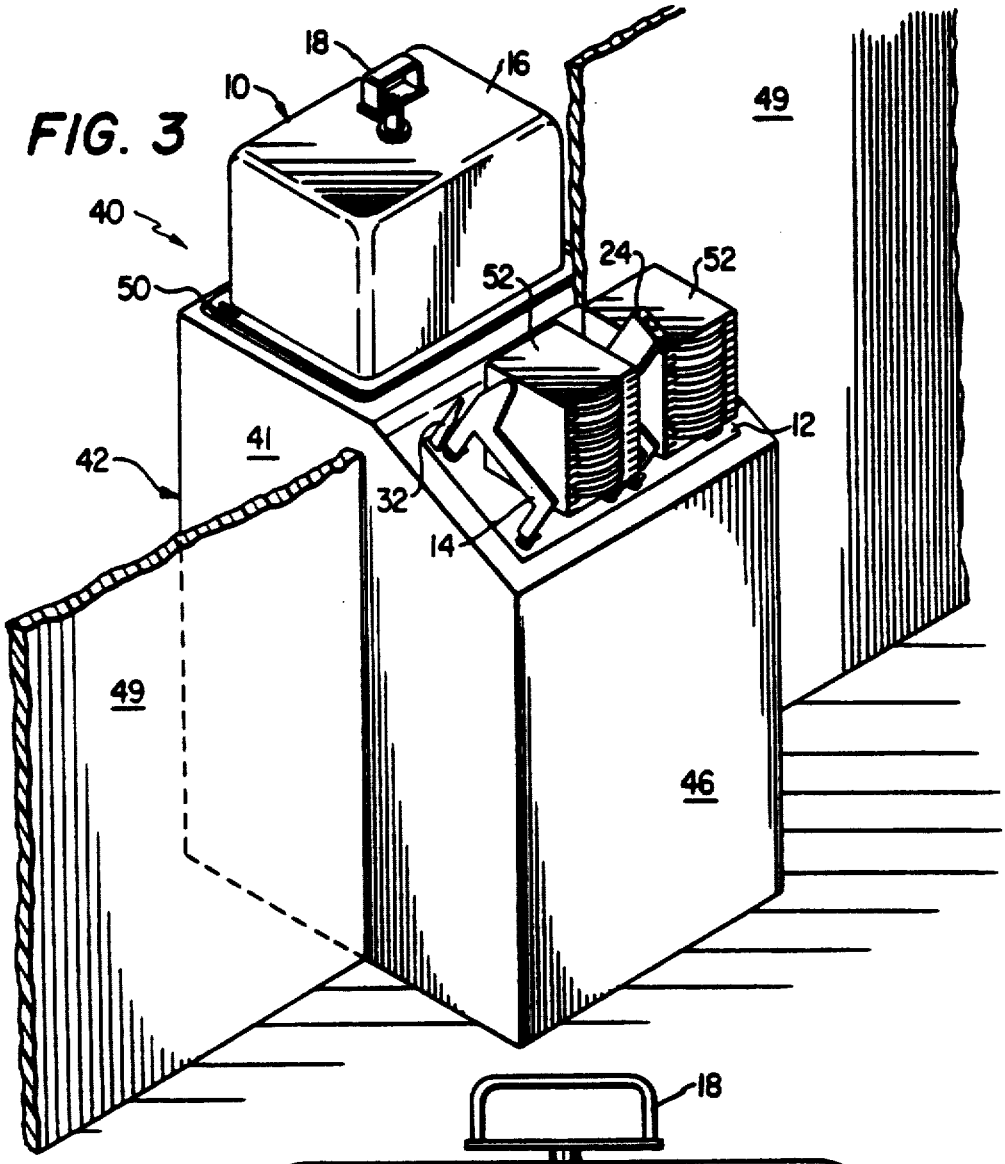
FIG. 3 is a perspective view of the transport mechanism of the present invention.

Referring now to the Drawings, wherein like reference numerals designate like or corresponding parts throughout, FIG. 1 shows a sectional view of the clean carrier which is used in conjunction with the transport mechanism of the present invention. As shown in FIG. 1, the carrier 10 comprises a base 12, a pair of spring mounted cradles 14 mounted on base 12 for each supporting a semiconductor slice cassette. Each slice cassette contains a plurality of semiconductor slices ready for further processing. A cover 16 is disposed on base 12 to provide a sealed volume. A handle 18 is attached to a latch 20, which removably couples cover 16 onto base 12 and which is adapted to be received in a latch tube 24 mounted proximate the center of the base 12. As also shown in FIG. 1, carrier 10 includes a pair of high-efficiency particle filters 26 mounted in apertures through base 12 beneath cradles 14.

FIG. 2 is a bottom view of base 12 of the carrier 10. As shown in FIG. 2, guide slots 28 are provided at the forward edges and on both sides of base 12. Those slots are provided to matingly engage with cooperating protrusions located on the transport mechanism, as described hereinafter in greater detail. Orifice 30 is provided at the terminal end of latch tube 24 and extends to the exterior of base 12. Guide members 32 are disposed on both sides of base 12 in order to properly position cover 16 over base 12. Further details of the construction of carrier 10 are set forth in the above identified co-pending patent application Ser. No. 644,282, the disclosure of which is incorporated herein by reference.

Referring now to FIG. 3, a perspective view of the transport mechanism of the present invention is shown. As shown in FIG. 3, the transport mechanism 40 comprises a substantially rectangular hosing 41 having a forward portion 42 positioned in the people-occupied area of the clean room which is an area of relatively high contamination and a rear portion 46 positioned in the process machine area which is in area of relatively low contamination. The process machine area is aerodynamically isolated from people behind an air drop panel 49 extending from near the filter ceiling of the clean room to near the flow of the room. Housing 41 is mounted through an opening in panel 49.

In accordance with the present invention, transport mechanism 40 is adapted to initially receive clean carrier 10 in the people-occupied area of the clean room. Carrier 10 is positioned on the transport mechanism with base 12 being secured in place on a moveable glider plate assembly 50 (shown in more detail in FIGS. 4, 5, 8, and 9). Plate assembly 50 is initially positioned in an aperture provided in the upper surface of forward portion 42. When the transport mechanism is activated, clean carrier 10 is opened, and glider plate 50 along with base 12 drops away from cover 16 and is transported through housing 41 and repositioned in an aperture located in rear portion 46. As base 12 is separated from cover 16, cover 16 is lowered onto the top surface of forward portion 42 to overlay the aperture provided therein. Cover 16 is sealed about the aperture on a contact seat disposed about the periphery of the aperture. Air from the people-occupied environment is thus restricted from entering the transport mechanism 40.

FIG. 3 shows cover 16 positioned in a sealed relationship on the upper surface of forward portion 42. The transported semiconductor slice cassettes 52 are [shon] *shown* positioned on rear portion 46 in preparation for loading the process machine.

Figure 4:
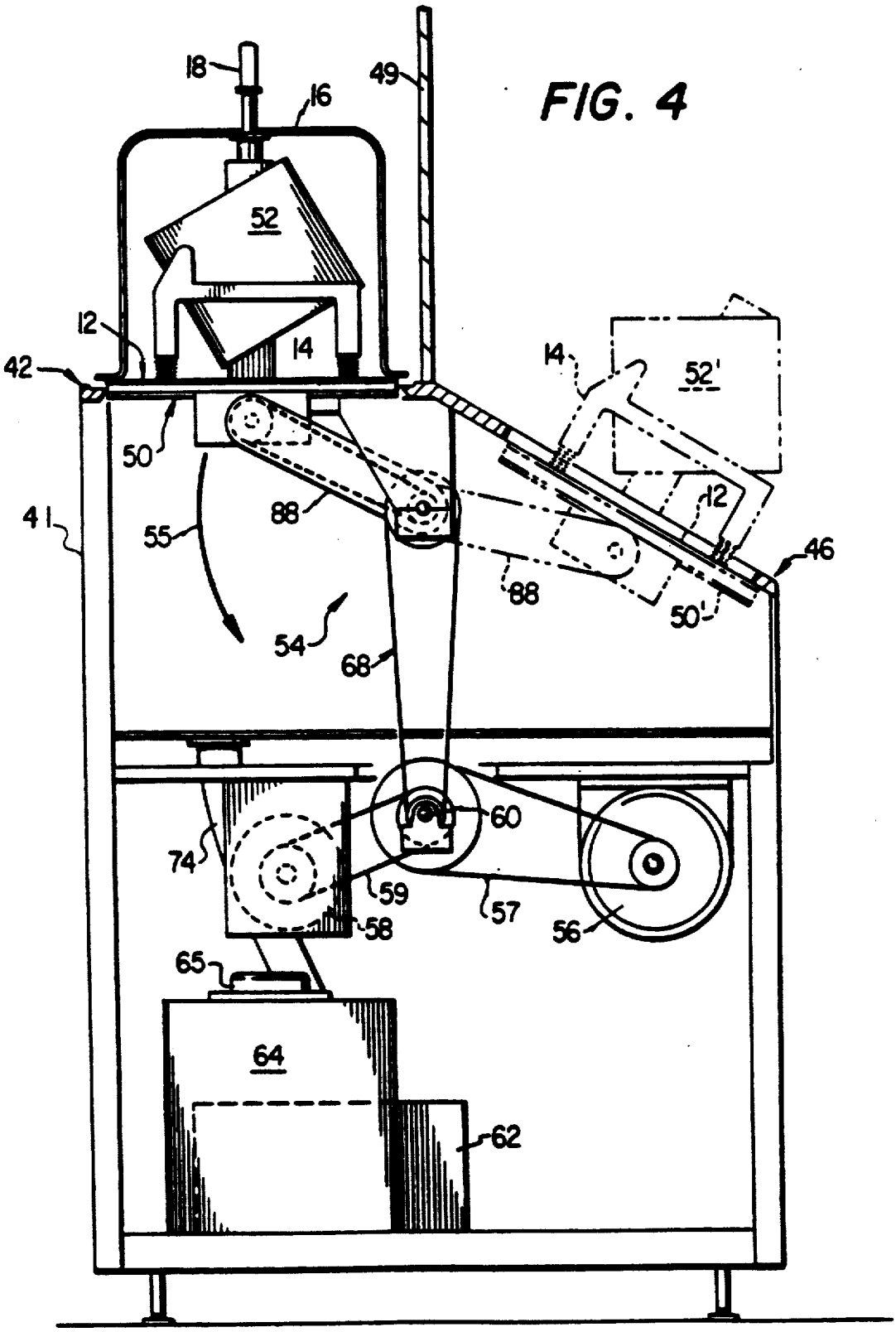
FIG. 4 is a sectional side view of the transport mechanism of FIG. 3.

FIG. 4 is a sectional side view of the transport mechanism of the present invention and illustrates the transitional movement of the semiconductor slice cassettes 52 between forward portion 42 and rear portion 46. As shown in FIG. 4, a transport and gearing mechanism 54, to be subsequently described, cooperates with glider plate 50 to move base 12 within housing 41 in the direction of arrow 55 through an angle of approximately 200°. The semiconductor slice cassettes 52 are thus transported between forward portion 42 and rear portion 46 (shown as 52'). As shown in FIG. 4 and described in greater detail in the co-pending patent application, carrier 10 is designed so that the semiconductor slice cassettes are supported therein on base 12 at an angle of approximately 30° to said horizontal. Because it is desirable to present the semiconductor slices to the process machine in a substantially horizontal orientation, gearing mechanism 54 is designed so that glider plate 50 is presented at rear portion 46 at an angle of approximately 30°. The semiconductor slice cassettes 52' are thus substantially vertically oriented at rear portion 46, with the slices being thus presented in the desired horizontal orientation.

Figure 5:
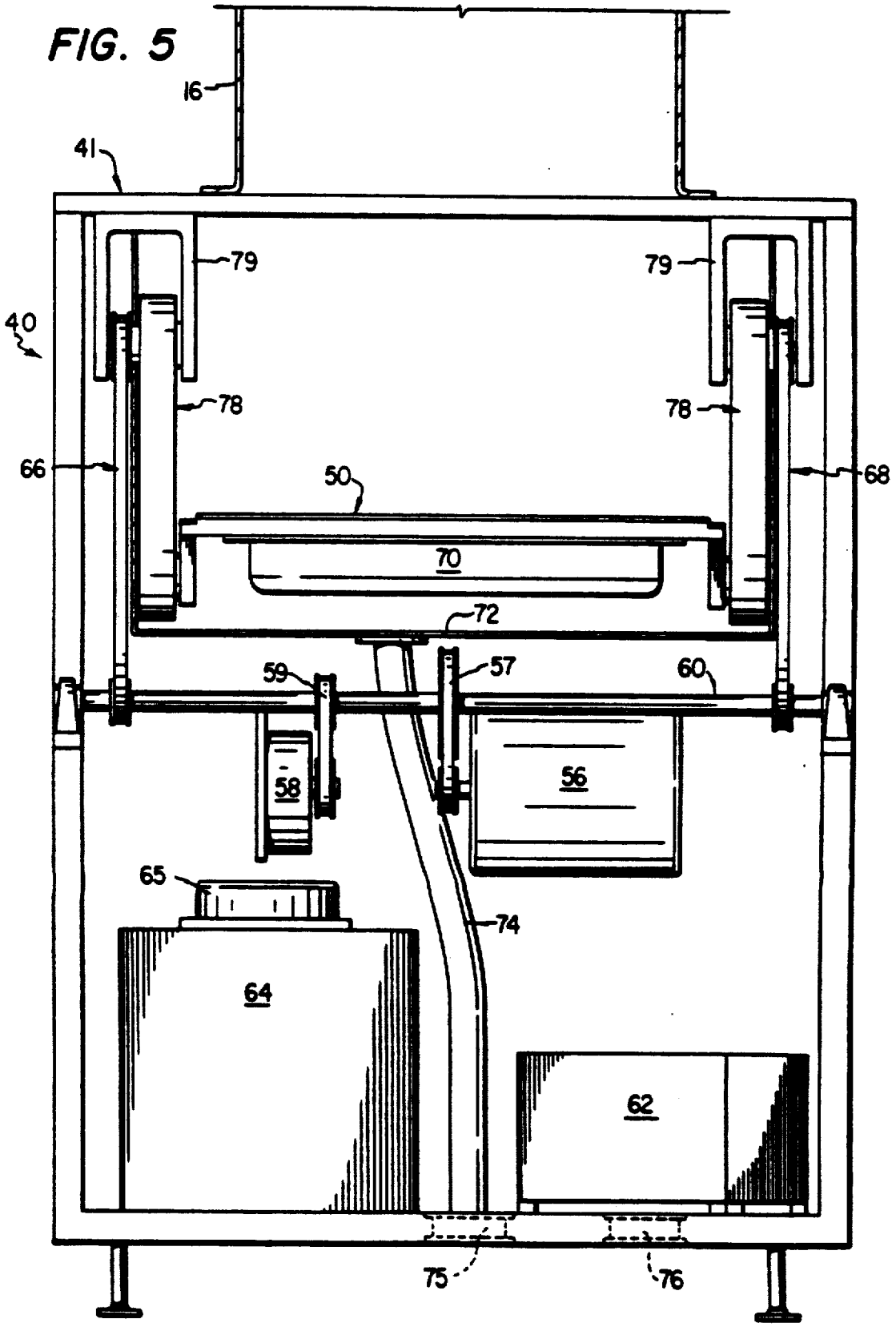
FIG. 5 is a sectional front view of the transport mechanism.

FIG. 5 is a section front view of the transport mechanism of the present invention, taken from the forward portion 42, with the base 12 and slice cassettes 52 omitted for clarity of illustration. As shown in FIGS. 4 and 5, the transport mechanism comprises a number of controls including a drive motor 56 and a brake 58 coupled through belts 57 and 59 to drive and brake a drive shaft 60. A power supply 62, a circuit card rack 64 and associated cooling fan 65 are provided proximate the bottom surface of housing 41, and are interconnected to provide power and control of the system. The transport mechanism also comprises a pair of belt drive assemblies 66, 68 positioned on and cooperating with the opposing sides of glider plate 50 to effect movements of the glider plate 50 between forward portion 42 and rear portion 46.

Figure 6:
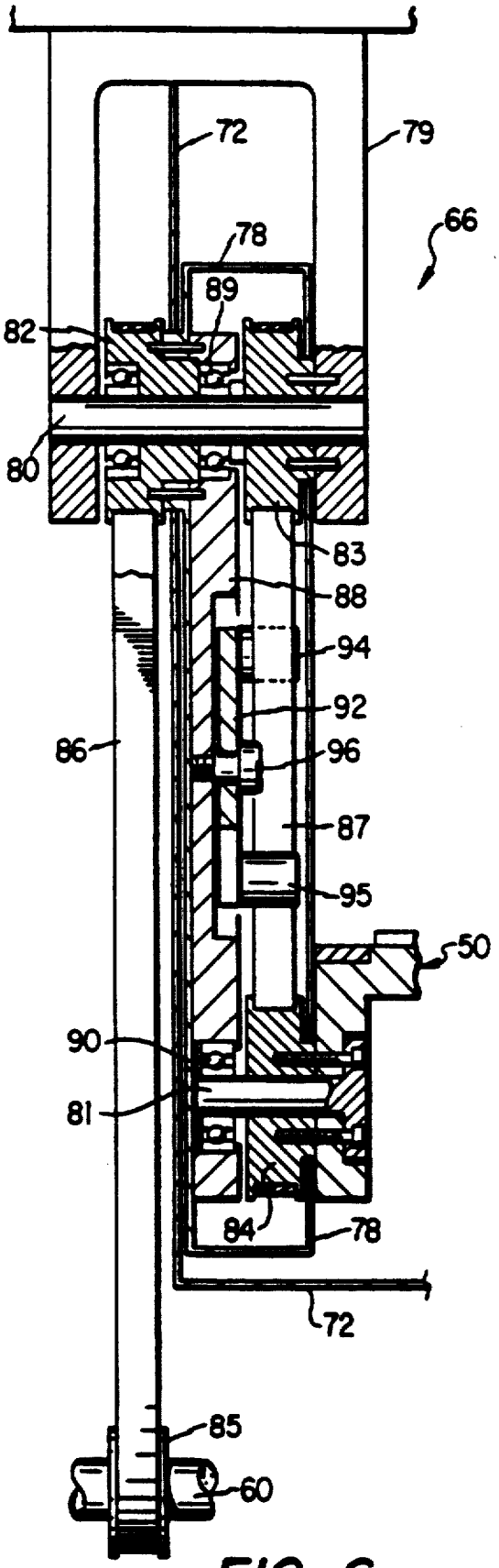
FIG. 6 is a sectional front view of the drive belt assembly.

Transport mechanism 40 also comprises a purge plate assembly 70, which includes glider plate 50, shown in greater detail in FIG. 6. As shown in FIG. 5, the area of housing 41 containing purge plate assembly 70 and a portion of belt drive assemblies 66 and 68 is encapsulated in a stainless steel enclosure 72. Enclosure 72 thus isolates that portion of housing 41 from the particulate generating motors and fans located in the lower portion of the machine. This isolation reduces the risk of particulate contamination being introduced to the semiconductor slices as the semiconductor slice cassettes are being transported through the housing. A flexible hose 74 is attached to enclosure 72 and communicates with an orifice provided in the bottom surface of the enclosure 72. Hose 74 extends downwardly through housing 41 to an exhaust fan 75 located on the bottom surface of the housing.

The fan 75 is exhausted to an external area to thereby decrease the pressure within the interior of the housing 72. Generally, an area maintained at a low contaminated level is pressurized with respect to an adjacent higher contamination level area. This pressure difference minimizes the movement of particulate matter from the high to the low contamination areas. The pressure in the housing 72 is maintained at a pressure lower than both the low contamination machine process area and the high contamination people occupied area. In this manner, any contaminating particles that enter the housing 72 are exhausted through the tube 74. The air flow induced by the pressure difference between the areas facilitates the isolation of the two areas and allows the base 12 with the attached cassette carrier 52 to pass from one area to another with minimum particulate transfer therebetween.

A second exhaust fan 76 is also provided on the bottom surface of housing 41 for exhausting the unenclosed portions of the transport mechanism. Because particles will also be generated by belt drives 66 and 68 as a result of the contacting of their constituent belts and gears, a shroud 78 is disposed about the portion of each of said belt drive assemblies situated within enclosure 72. Shroud 78 may also include a fitting (not shown) for attachment to a vacuum source so that particles trapped within the shroud can be evacuated.

FIG. 6 is an isolated front view of the drive belt assembly 66, it being understood that drive belt assembly 68 is identical. A first shaft 80 is disposed proximate the upper surface of the housing 41 and is secured thereto by an inverted yoke 70. A second shaft 81 is attached to glider plate 50. Pulleys 82 and 83 are attached to shaft 80 in side-by-side relationship. Pulley 83 is pinned to yoke 70 and does not rotate. Shaft 80 also does not rotate. A third pulley 84 is attached to shaft 81. A pulley 85 is attached to drive shaft 60 for rotation therewith. Belt 86 is disposed about pulleys 82 and 85 and a second belt 87 is disposed about pulleys 83 and 84. Pulley 82 is pinned to the upper portion of an arm 88 which is rotatably connected about shaft 80 by bearings 89. Thus, rotation of pulley 82 causes rotation of the upper part of arm 88 about shaft 80. The lower part of arm 88 is connected through bearings 90 to shaft 81. Pivoting of arm 88 thus causes shaft 81 and glider plate 50 to move about an arc centered at shaft 80. This causes the glider plate 50 to move along the 200° arc between the two positions shown in FIG. 4.

Belt 87 is disposed around pulleys 83 and 84 and thus causes pulley 84 to rotate as arm 88 swings about its arc. Rotation of pulley 84 causes glider plate 50 to rotate in order to maintain glider plate 50 substantially horizontal during travel between its two locations.

Figure 7:
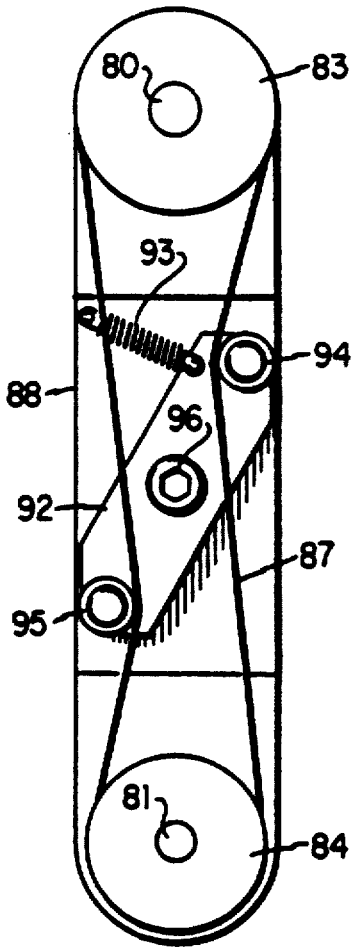
FIG. 7 illustrates a belt tensioning device for use with the belt assembly of FIG. 6.

FIG. 7 illustrates a belt tensioner device for use with the belt assemblies of FIG. 6. The tensioner is mounted on arm 88 and comprises a block 92 having a spring 93 and a pair of rollers 94 and 95 provided at either end thereof and positioned to contact and press against belt 87 disposed about pulleys 83, 84. Block 92 is pivotable about a pivot 96 mounted on arm 88. When incorporated into the transport mechanism of the present invention the tensioner acts to prevent the belt 87 from slipping as pulleys 83, 84 on which it is disposed is rotated. The tensioner device thus facilitates the positioning of glider plate 50 on rear portion 46 of the transport mechanism. Because the glider plate may not approach rear portion 46 at the exact orientation so as to present the semiconductor slice cassettes in the aperture located in the upper surface of portion 46, the tensioner allows the belt to give slightly, so that the glider plate 50 will properly orient itself proximate the aperture.

Figure 8:
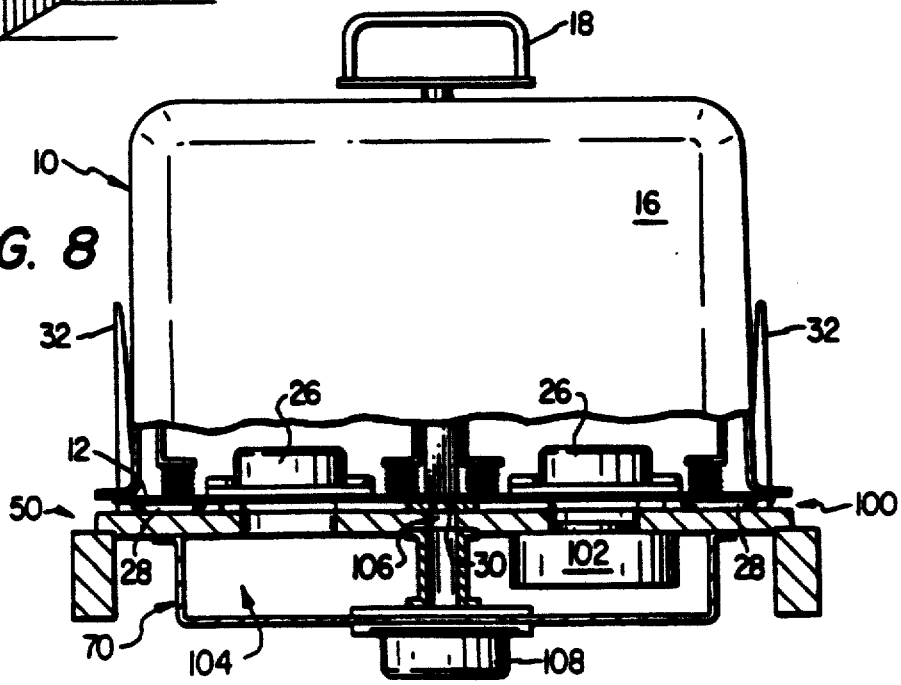
FIG. 8 is a sectional view of the glider plate assembly.

FIG. 8 is a sectional view of the purge plate assembly 70, including glider plate 50 with a clean carrier 10 positioned thereon. As described above with respect to FIG. 1, guide slots 28 are provided on the underside of clean carrier 10. Slots 28 are adapted to matingly engage with orienting protrusions located on the upper surface of glider plate 50 in order to secure carrier 10 to plate 50. Glider plate 50 is designed to correspond symmetrically to base 12 of carrier 10 and includes apertures which communicate with filters 26 and orifice 30. A raised plastic strip extends along the forward edge of the glider plate so that when the carrier is positioned thereon, a small gap 100 will be created between the bottom of the carrier and the top of the glider plate.

Purge plate assembly 70 is shown in FIG. 8 and includes a fan 102 attached to the lower surface of glider plate 50. Fan 102 is positioned to communicate through glider plate 50 with filters 26 located on the base of the carrier and is provided within an encapsulated area 104.

A spacer 106 is positioned proximate the center of glider plate 50 between the guider plate and encapsulated fan area 104. Spacer 106 communicates with orifice 30 of carrier 10 through an orifice located in the glider plate and extends therefrom downwardly through area 104 to communicate with a filter 108 mounted on the bottom of the area 104.

Fan 102 is designed to guard against the introduction of particulate contamination from the people-occupied environment into the transport mechanism when the carrier 10 is opened at the commencement of the transport operation. Thus when the carrier is positioned on glider plate 50, a purging operation will be initiated in which fan 102 will be activated to direct air into carrier 10 through filters 26 to thereby create a positive pressure within the carrier. When the carrier is thereafter opened, any loose particles in the area surrounding the junction of the cover and base of the carrier will be swept away from the carrier enclosure. As air is thus introduced through glider plate 50 into filters 26, gap 100 between the bottom of the carrier and the glider plate will be under negative pressure to supply air to the fan 102 through an orifice in the purge plate assembly 70. Any particulate contamination in that area generated as a result of the contacting of the cooperating portions of the glider plate and the carrier will be prevented from entering the clean carrier by the filters 26. In addition, the slight positive pressure build-up within carrier 10 will force air down latch tube 24, which air will then travel down the center of the tube away from the latching mechanism contained therein and through the glider plate and spacer and be directed through filter 108. The filtering of this air thus further reduces the risk of particulate contamination being introduced into the transport mechanism.

FIG. 9 illustrates the operation of the belt drive assemblies 66 and 68 to cause glider plate 50 to swing downwardly about a 200° arc and be pivoted toward rear portion 46 at an angle of approximately 30°. Shroud 78 encompasses the pulley and belt structure shown in FIG. 6. As shown in FIG. 9 and described above with reference to earlier FIGURES, the combination of the belts, pulleys and shafts of the invention are operative to cause glider plate 50 to move in a 200° arc in the direction to arrow 110. Glider plate 50 is thus moved to position 50'. Upon actuation of a switch (not shown) by the operator, motor 56 is actuated by control signals generated from electronic circuitry in card rack 64. The glider plate 50 is then moved to the desired position with the process area, where the brake causes the plate 50 to be stopped. The semiconductor slices are presented at the desired angle for further processing. Actuation of the switch by the operator then causes the plate 50 to be moved to the original position for reloading of the carrier with new slices or returning processed slices.

In summary, a transport mechanism has been described for transferring semiconductor cassettes and slices between a portable carrying unit in the people-occupied area of a clean room and a process machine area aerodynamically isolated from people without exposing the slices to particulate contamination or introducing particulate contamination to the process machine area.

Although the preferred embodiment has been described in detail, it should be understood that various changes, substitutions, and alterations can be made therein without departing from the spirit and scope of the invention as defined by the appended claims.

What is claimed is:

1. An apparatus for transporting semiconductor slice cassettes in a portable carrier between a high contamination area and a low contamination area, said portable carrier having a base carrying the slice cassettes and a cover removably attached to the base, comprising:

a housing having a forward portion disposed in the high contamination area and a rear portion positioned in the low contamination area said rear portion isolated from said forward portion by a barrier wall;

said housing having an interior portion in communication with the high contamination area through a first access opening in said forward portion and with the low contamination area through a second access opening in said area portion;

the cover of the portable carrier being sealingly receivable over the first access opening in isolate the interior portion of the housing from the high cotamination area;

means for creating a positive pressure within the portable carrier prior to removing of the cover of the portable carrier from the base;

means for creating a negative pressure within the interior of said housing relative to both the high and low contamination areas;

support means disposed within said housing for receiving the base of the portable carrier and operable to be alternately disposed proximate said first access opening and said second access opening to move the base of the portable carrier and the slice cassettes therebetween; and motive force means disposed within said housing for causing said support means and at least a portion of the portable carrier to be moved between said first access opening and said second access opening.

2. The apparatus of claim 1 and further comprising arm means pivotally connected between said support means and a pivot point within said housing for moving the carrier about an arc between said first and second access openings.

3. The apparatus of claim 1 wherein said motive force means comprises:

a motor;

a drive shaft connected to said motor for rotation thereof; and drive belt assembly means positioned on opposing sides of said support means for cooperating with said drive shaft to cause vertical and pivotable movement of said support means.

4. The apparatus of claim 3 wherein said drive belt assembly comprises:

a first shaft secured within said housing;

a second shaft attached to said support means;

first and second pulleys attached to said first shaft in side-by-side relationships;

a third pulley attached to said second shaft;

a fourth pulley attached to said drive shaft for rotation therewith;

a first belt disposed about said first and fourth pulley; and a second belt disposed about said second and third pulley.

5. The apparatus of claim 4 and further comprising an enclosure positioned to surround said support means and a portion of said belt drive assemblies containing said second belt, said second and third pulleys and the portion of said second shaft supporting said second belt.

6. The apparatus of claim 4 and further comprising a belt tensioner to prevent said belts from slipping off said pulleys as the pulleys are rotated.

7. The apparatus of claim 5 and further comprising a shroud disposed about said portions of said belt drive assemblies.

8. The apparatus of claim 5 wherein said means for creating a negative pressure within the interior of said housing relative to both the high and low contamination areas comprises an exhaust fan positioned on the bottom inner surface of said housing.

9. The apparatus of claim 8 wherein an aperture is provided at the bottom of said enclosure and extends to the exterior thereof for attachment through a hose to said exhaust fan.

10. The apparatus of claim 8 and further comprising a second exhaust fan positioned on the bottom inner surface of said housing for evacuating particulate contamination therefrom.

11. An apparatus for transporting semiconductor slice cassettes in a portable carrier having a detachable cover and base between a high contamination area and a low contamination area comprising:

a housing having a forward portion disposed in the high contamination area and a rear portion positioned in the low contamination area and isolated from said forward portion behind an air drop panel disposed between the high and low contamination areas;

said housing having its interior in communication with the high contamination area through a first access opening in said forward position and with the low contamination area through a second access opening in said rear portion;

said first access opening mating with the cover of the portable carrier to allow the base to pass therethrough and support the cover to seal the interior of the housing from the high contamination area;

support means within said housing for cooperating with the base of the carrier to provide support therefor and adapted to be alternately disposed proximate said first access opening and said second access opening, said support means having:

a guider plate having means positioned thereon to matingly engage with the base of the carrier;

an arm connected to said plate and pivotable about an arc between said forward and rear portions;

means for creating a positive pressure within the portable carrier prior to removing of the cover of the portable carrier from the base;

means for creating a negative pressure within the interior of said housing relative to both the high and low contamination areas;

motive force means disposed within said housing for causing said arm to pivot said support means and the carrier base mounted thereon between said forward portion and said rear portion.

12. The apparatus of claim 11 wherein said means for creating a positive pressure within the portable carrier comprises a fan positioned below said guider plate and attached thereto, said fan encapsulated in a sealed enclosure for directing air towards the base of the portable carrier and to the interior thereof.

13. The apparatus of claim 12 wherein said support means further comprises a tubular spacer positioned between said glider plate and said fan enclosure at the center of said glider plate and extending from said glider plate through said fan enclosure to communicate with a breathing orifice on the base of the portable carrier.

14. The apparatus of claim 11 wherein said glider plate is constructed so as to conform substantially to the base of the carrier and includes apertures which communicate with the breathing orifices on the portable carrier and with an orifice provided at the terminal end of the latch tube of the carrier.

15. The apparatus of claim 12 wherein a plastic strip is provided along the forward edges of said glider plate so that when the base is secured to said glider plate, a gap is formed between the bottom surface of the carrier and the upper surface of the glider plate.

16. The apparatus of claim 13 wherein said fan is adapted to direct air into said carrier through said glider plate and the filters of said carrier to create a positive pressure within said carrier and to also create a negative pressure within the gap between said glider plate and said carrier to prevent introduction of particulate contamination into said carrier when said carrier is opened.

*17. An interface between first and second containers used for semiconductor wafer manufacture, comprising:*

*(a) a first door for sealing the first container;*

*(b) a second door for sealing the second container;*

*(c) said first and second doors each having a mating outer surface so that substantially all contamination which has accumulated on exterior surfaces of the doors when the containers are separated will be trapped when the containers are positioned together; and*

*(d) further including an elevator coupled to said doors for transporting said doors into said containers as a single unit while said doors are coupled together at their mating outer surfaces.*

*18. An interface between first and second containers, comprising:*

*(a) a first door for independently sealing the first container;*

*(b) a second door for independently sealing the second container;*

*(c) said first and second doors each having a mating outer surface of substantially equal exterior dimensions so that substantially all contamination which has accumulated on the exterior surface of the doors when the containers are separated will be trapped when the containers are positioned together; and*

*(d) an elevator coupled to said doors for transporting said doors into said containers as a single unit while said doors are coupled together at their mating outer surfaces.*

*19. The interface of claim 18 wherein the first container is isolated from ambient.*

*20. The interface of claim 18 wherein the first container prevents contamination.*

*21. The interface of claim 18 wherein the first container prevents contamination from entering the inside of the container.*

*22. The interface of claim 18 wherein the interface prevents contamination.*

*23. The interface of claim 18 wherein the interface prevents contamination of the inside of the first container.*

*24. The interface of claim 18 wherein the interface prevents contamination of the inside of the second container.*

*25. The interface of claim 18 wherein the first container is maintained at atmospheric pressure.*

*26. The interface of claim 18 wherein the first container is maintained at ambient pressure.*

*27. The interface of claim 18 wherein ambient contains particulate contamination.*

*28. The interface of claim 18 wherein wafers are stored in the first container.*

*29. An semiconductor wafer manufacturing system, comprising:*

*(a) a clean carrier;*

*(b) a base controllably attached to the clean carrier for sealing the clean carrier;*

*(c) a transport unit;*

*(d) a glider plate attached to the transport unit;*

*(e) the base and the glider plate each having a mating outer surface of substantially equal exterior dimensions so that substantially all contamination which has accumulated on the exterior surface of the doors when the carrier and transport unit are separated will be trapped when the base and the glider plate are positioned together; and*

*(f) a transport mechanism coupled to the glider plate and base for transporting the base and the glider plate into the clean carrier and the transport unit as a single unit while said doors are coupled together at their mating outer surfaces.*

*30. A method of interfacing a wafer carrier to a housing, comprising the steps of:*

*(a) providing a door for the wafer carrier;*

*(b) providing a door for an opening in the housing;*

*(c) placing the wafer carrier so that its door mates with the housing door; and*

*(d) trapping particulates located between the two mated doors.*

*31. The method of claim 30 further comprising:*

*(a) transporting the two mated doors as a unit into the interior of the housing.*

*32. The method of claim 30 further comprising:*

*(a) using the wafer carrier to cover the housing opening to prevent particulates from entering the housing.*

* * * * *